United States Patent
Schneider et al.

(10) Patent No.: US 6,826,111 B2
(45) Date of Patent: Nov. 30, 2004

(54) ON CHIP SCRAMBLING

(75) Inventors: Ralf Schneider, Munich (DE);
Evangelos Stavrou, Munich (DE);
Tobias Hartner, Munich (DE);
Norbert Wirth, Unterschleibheim (DE)

(73) Assignee: Infineon Technologies AG, Munich (DE)

( * ) Notice: Subject to any disclaimer, the term of this patent is extended or adjusted under 35 U.S.C. 154(b) by 166 days.

(21) Appl. No.: 10/186,327

(22) Filed: Jun. 28, 2002

(65) Prior Publication Data

US 2003/0048672 A1 Mar. 13, 2003

(30) Foreign Application Priority Data

Jun. 28, 2001 (DE) .......................................... 101 31 277

(51) Int. Cl.⁷ ................................................. G11C 8/00
(52) U.S. Cl. ................... 365/230.06; 365/201; 714/718; 714/743
(58) Field of Search ............................ 365/230.06, 200, 365/201; 714/718, 743

(56) References Cited

U.S. PATENT DOCUMENTS

| | | | | |
|---|---|---|---|---|
| 5,844,914 A | | 12/1998 | Kim et al. .................. 371/21.1 |
| 5,925,141 A | * | 7/1999 | Ariki .......................... 714/718 |
| 5,943,283 A | * | 8/1999 | Wong et al. ........... 365/230.01 |
| 6,065,143 A | * | 5/2000 | Yamasaki et al. ........... 714/720 |

* cited by examiner

Primary Examiner—Richard Elms
Assistant Examiner—Toan Le
(74) Attorney, Agent, or Firm—Fish & Richardson P.C.

(57) ABSTRACT

A method includes providing a semiconductor memory device having at least one memory cell array. The memory cell array has a multiplicity of memory cells arranged in a matrix-like manner. Each of the memory cells is assigned a physical address and an electrical address. The method also includes inputting a physical address of a memory cell that is to be addressed into an address input device of the semiconductor memory device, decoding the input physical address into the assigned electrical address of the memory cell to be addressed by an address decoder device of the semiconductor memory device, and outputting the electrical address to the memory cell array in order to address the memory cell.

21 Claims, 1 Drawing Sheet

ON CHIP SCRAMBLING

FIELD OF INVENTION

The invention relates to a method for the address-decoded operation of a semiconductor memory device in accordance with claim 1 and to a semiconductor memory device in accordance with claim 4.

BACKGROUND

Semiconductor memory devices, for example DRAM memories, typically comprise at least one memory cell array in which a multiplicity of memory cells are arranged in a matrix-like manner. An individual memory cell is designed for storing binary data, i.e. a logic "0" or a logic "1". These memory cells can be addressed in the matrix-like memory cell array by the specification of their assigned electrical address. The electrical address comprises, in a simplified fashion, a row specification and a column specification, i.e. an X value and a Y value.

However, modern semiconductor memory devices have complex memory cell arrays in which the so-called electrical address counting differs from the physical address counting. A physical address is in this case understood to be a physical position of a respective memory cell in the matrix-like memory cell array, which position is specified by X and Y coordinates. Consequently, if the intention is to address a specific memory cell with a physical address (X; Y), then the electrical address (X'; Y') assigned to this memory cell must be known. Only if the physical addressing coincides with the electrical addressing can a memory cell with the physical position (X=5; Y=1), for example, be addressed by the inputting of the electrical address (X'=5; Y'=1). Generally, however, in order to address the memory cell with the specified physical address, it is necessary to input an electrical address that deviates therefrom, e.g. (X'=7; Y'=9).

This divergence of physical and electrical address counting causes considerable problems during the testing of the memory cell array which follows the fabrication of the semiconductor device. Thus, during the testing of the memory cell array, particular attention has to be directed toward a possibly functionally harmful interaction of adjacent memory cells. By way of example, the physical memory state of one memory cell (e.g. a positively or negatively charged storage capacitor) can influence an adjacent memory cell such that a write or read operation of this memory cell would lead to an incorrect result. In order to be able to preclude such possibly functionally harmful proximity effects of memory cells in the memory cell array, the cell array must be able to be brought into predetermined data topologies during the testing of the semiconductor device. A test of the memory cell array may, for example, involve testing whether error-free operation of the memory cell array is possible even when a chessboard topology of memory cells in a first and a second physical memory state (for example negatively and positively charged storage capacitors) is generated in the memory cell array.

In the same way, the order of access to the memory cells must also be taken into consideration during the testing of the memory cell array. In addition to the description of the test sequence of the semiconductor memory device, the so-called pattern encompassing the type of access, order of access and data topology, it is necessary, however, in modern semiconductor memory devices in which the physical and electrical address counting diverge, to program a so-called address scrambling in the test system used. This is because if the intention is to generate, for example, a chessboard topology in the memory cell array, then the test system must know the mapping or assignment of the electrical to the physical addresses of the memory cells. In order to bring a specific memory cell with a physical address (X; Y) into a specific physical memory state, the external test system must possess the assignment information in order to be able to output the electrical address required for addressing this memory cell to the semiconductor memory device.

On account of the continual advancing optimization of chip area and performance of modern semi-conductor memory devices, every new semiconductor memory device typically has a new, dedicated memory architecture, as a result of which there is a change in the items of assignment information between physical and electrical address counting. Consequently, every new semiconductor memory device requires a different address scrambling which must be programmed individually for this semiconductor memory device in the external test system. The programming of the external test systems is thus dependent on the respective semiconductor memory devices to be tested (the so-called DUT (device under test)). In many, in particular older, test systems, on account of the required data topologies whose complexity is constantly increasing, the program flexibility thereof no longer suffices for the required address scrambling. In any event, the programming of the test systems is very complicated and prone to errors.

Since external test systems are not subject to a uniform standard, moreover, each test system must be programmed individually. However, a semiconductor memory device typically passes through various test areas (for example bench, front-end test, back-end test and burn-in), various external test systems being used in each test area. An added difficulty is that a plurality of different test systems are possibly used within these test areas. By way of example, HP, Mosaid, IMS are used for the bench tests, Advantest and Teradyne are used for the front-end test and back-end test, and MTX and ANDO are used for the burn-in test. Individual address scrambling methods have to be programmed, if appropriate, for all these different test systems.

SUMMARY

In view of the disadvantages mentioned above, it is an object of the invention to specify a semiconductor memory device which can be tested in a simple manner by different external test systems. Furthermore, it is an object of the invention to specify a corresponding method.

According to the invention, a method for the address-decoded operation of a semiconductor memory device, in particular of a semiconductor memory device according to the invention, comprises the following steps:

provision of the semiconductor memory device having at least one memory cell array, which has a multiplicity of memory cells arranged in a matrix-like manner at least in regions, each of the memory cells being assigned a physical address (X; Y) corresponding to the physical position of the memory cell in the memory cell array and an electrical address (X'; Y') corresponding to the electrical addressing of the memory cell in the memory cell array;

inputting of a physical address (X; Y) of a memory cell of the memory cell array that is to be addressed into an address input device of the semiconductor memory device;

decoding of the input physical address (X; Y) into the assigned electrical address (X'; Y') of the memory cell to be addressed by an address decoder device of the semiconductor memory device; and outputting of the electrical address (X'; Y') to the memory cell array in order to address the memory cell to be addressed.

The method for address-decoded operation according to the invention accordingly relates to a semiconductor memory device having a memory cell array which is matrix-like at least in regions. Each memory cell of the memory cell array thus has a physical address corresponding to its physical position in the memory cell array. By way of example, the very top left memory cell has the physical address (X=0; Y=0). Each memory cell is also assigned an electrical address which—expressed in a simplified fashion—must be applied to the row and column decoders of the memory cell array in order to be able to effectively address said memory cell. If the physical and electrical address counting diverge in the semiconductor device, then the electrical address (X'; Y') deviates, if appropriate, from the physical address (X; Y) of the memory cell to be addressed.

In order to address a specific memory cell with the physical address (X; Y), the method according to the invention, in address-decoded operation, allows a simple addressing of this memory cell, however. Thus, the physical address of the memory cell to be addressed can be input directly—for example from an external test system—into an address input device of the semiconductor memory device. The semiconductor memory device comprises an address decoder device which decodes this input physical address into the assigned electrical address of the memory cell to be addressed. The "address scrambling" is thus effected directly by the address decoder device on the semiconductor memory device. The electrical address thus decoded is subsequently output to the memory cell array (i.e. in particular to the row and column decoders) in order to address the memory cell to be addressed.

Consequently, the external test system advantageously need not contain any items of assignment or mapping information between physical and electrical address counting. Rather, it suffices for the external test system to address the memory cell to be addressed directly with its physical address (X; Y), since the address decoder device ensures that the electrical address assigned to this physical address is output for the proper addressing of the memory cell to be addressed. This considerably simplifies the programming of external test systems, since the complicated programming, prone to errors, of the address scrambling can be completely omitted. Advantageously, the semiconductor memory device can also be operated in an address normal mode, in which the address decoder device performs no such decoding of input addresses. Instead of this, in such a mode—in a customary manner—input addresses can be output directly as electrical addresses to the memory cell array.

The invention furthermore proposes a method for the data-decoded operation of a semiconductor memory device which can preferably be combined with the method for address-decoded operation according to the invention and comprises the following steps:

provision of the semiconductor memory device having at least one memory cell array, which has a multiplicity of memory cells arranged in a matrix-like manner at least in regions, inputting of data that are to be written to the memory cell to be addressed and have two logic data states into a data input device of the semiconductor memory device;

decoding of the input data by a data decoder device of the semiconductor device in such a way that in the event of data inputting of the first logic data state, such a decoded data state is generated which is assigned to a predetermined first physical memory state of the memory cell to be addressed, and in the event of data inputting of the second logic data state, such a decoded data state is generated which is assigned to a predetermined second physical memory state of the memory cell to be addressed; and outputting of the decoded data state to the memory cell array in order to bring the memory cell to be addressed into the respective physical memory state.

In addition to an "address scrambling" which is implemented internally in the semiconductor memory device or externally in a test system, a so-called "data scrambling" is often necessary, too, in modern memory architectures. Thus, in specific memory architectures, by way of example, a logic "0" is stored, depending on the memory cell, in the form of a first physical state (for example a negatively charged storage capacitor) or a second physical state (for example a positively charged storage capacitor). In particular, the memory cell array may contain "normal" memory cells, in which a logic "0" are stored by the first physical memory state, and "inverted" memory cells, in which a logic "0", are stored by the second physical state. In order to be able to determine whether a memory cell to be addressed is a "normal" or an "inverted" memory cell, the electrical and/or physical address of said memory cell must be known.

Consequently, in order to be able to generate a predetermined data topology in the cell array of a semiconductor memory device with an architecture of this type, a data scrambling must be carried out. This was conventionally done by programming the information required for the "data scrambling" in the external test system. In order, according to a conventional method, for example, to generate a uniform-solid data topology of memory cells with positively charged storage capacitors, the external test system in each case output a logic "0" to the "normal" memory cells and in each case a logic "1" to the "inverted" memory cells. This "data scrambling" resulted in complicated programming, prone to errors, of the external test systems.

In accordance with the preferred method according to the invention, the "data scrambling" is effected by a data decoder device which is a component part of the semiconductor device. Consequently, the items of "data scrambling" information need no longer be part of the external test system. Instead, for all the memory cells—irrespective of whether "normal" or "inverted" memory cells are involved—a first logic data state can be input by the external test system, for example, into the data input device of the semiconductor device if the predetermined first physical memory state is intended to be generated in the memory cell to be addressed. Conversely, the second logic data state can be input into the data input device of the semiconductor memory device if the memory cell to be addressed is intended to be brought into the predetermined second physical memory state.

In accordance with a further preferred embodiment, the method according to the invention is additionally designed for the topology-generating operation of the semiconductor memory device and comprises the following further steps:

inputting of data that are to be written to the memory cell to be addressed and have two logic data states to a data input device of the semiconductor memory device;

outputting of such data to the memory cell array that a predetermined and/or programmable data topology, in particular a chessboard, line, multiple-line and/or a uniform-solid topology of memory cells in a first and a second physical memory state, is generated, preferably independently of the data input into the data input device, at least in a part of the memory cell array.

A "semiautomatic" topology-generating method is thus provided, whereby frequently recurring, typical data topologies can be implemented in a simple manner in the memory cell array. By way of example, for test purposes, the memory cell array of a semiconductor memory device is often put into a so-called chessboard topology in which the memory cells are in a chessboard—like pattern in the first or the second physical memory state (for example a negatively or positively charged storage capacitor).

In topology-generating operation, by way of example, the external test system need not output data corresponding to a chessboard pattern to the semiconductor memory device. Instead, it suffices, for example, if arbitrary data are input into the data input device of the semiconductor memory device, since, in topology-generating operation, such data are automatically output to the memory cell array that the predetermined and/or programmable data topology is generated (semiautomatically) at least in a part of the cell array. The data which are to be output to the memory cell array and correspond to the data topology to be generated are preferably provided by the data decoder device.

Preferably, in topology-generating operation, various generation methods are fixedly preprogrammed into the data decoder device and can be selected, in particular corresponding methods for generating a chessboard, line, multiple-line and/or uniform-solid topologies. In this case, it may be provided that the predetermined or predeterminable and/or programmable topologies are selected by means of control signals to be input, if appropriate in conjunction with a data signal that is likewise to be input. By way of example, the basic topology (e.g. a chessboard topology) can be selected by means of the control signal and a special topology of said basic topology (e.g. a chessboard topology with a logic "1" or "0" in the top left corner) can be selected by means of the data signal to be input, so that a selection between complementary topologies is possible by means of the data to be input However, the topologies can also be selected completely independently of the data input into the data input device, exclusively using the control signal.

The possibility of being able to program the data topology, which is intended to be created during topology-generating operation, externally into the semiconductor memory device is particularly preferred. By way of example, at the beginning of topology-generating operation, firstly the geometry of the data topology to be generated is communicated from the external test system to the semiconductor memory device, and is subsequently generated.

According to the invention, a semiconductor memory device comprises
at least one memory cell array, which has a multiplicity of memory cells arranged in a matrix-like manner at least in regions, each of the memory cells being assigned a physical address corresponding to the physical position of the memory cell in the memory cell array and an electrical address corresponding to the electrical addressing of the memory cell in the memory cell array;
at least one address input device for address inputting of the physical or the electrical address of a memory cell of the memory cell array that is to be addressed; and
at least one address decoder device which is signal-connected to the address input device and the memory cell array, the address decoder device, in an address decoder mode, being designed, in the event of address inputting of the physical address of the memory cell to be addressed, to output the electrical address assigned thereto to the memory cell array in order to address the memory cell to be addressed.

According to the invention, the address decoder device of the semiconductor memory device has an address decoder mode in which an "address scrambling" of addresses which are input into the address input device is performed. Consequently, by way of example, an external test system can directly address a memory cell of the memory cell array that is to be addressed by inputting the physical address of the memory cell to be addressed into the address input device. The address decoder device decodes this input physical address into the electrical address assigned to the memory cell to be addressed and outputs this assigned electrical address to the memory cell array (for example the row and column decoders), in order to address the memory cell to be addressed. The fact that the external test system can address the memory cells in a simple manner by outputting the physical addresses advantageously obviates the complicated programming of the "address scrambling" in the external test system.

The address input device of the semiconductor memory device is equally also designed for the address inputting of electrical addresses of memory cells to be addressed. Such address inputting of the electrical addresses is effected in particular when the address decoder device is not in the address decoder mode.

In accordance with a preferred embodiment, the address decoder device has at least the address decoder mode and an address normal mode, which can preferably be selected externally, an the address decoder mode, in the event of address inputting of the physical address of the memory cell to be addressed, the assigned electrical address being output to the memory cell array and in the address normal mode, the input address being output to the memory cell array.

Whereas an "address scrambling" of the input physical addresses into the assigned electrical addresses is effected in the address decoder mode of the address decoder device, the semiconductor memory device behaves like a conventional semiconductor memory device in the address normal mode of the address decoder device. In the address normal mode, the input addresses—which are electrical addresses of memory cells of the memory cell array—are output directly for addressing purposes to the memory cell array without an additional decoding of these input addresses having been effected. For example, for this purpose, the addresses which are input into the address input device in the address normal mode are looped through directly to the memory cell array, bypassing the address decoder device, and the input addresses may, if appropriate, be subjected to other signal-processing processes.

The address decoder mode and the address normal mode of the address decoder device can preferably be selected externally, for example by means of a control signal that is to be input into the semiconductor memory device In order that the user of the semiconductor memory device does not inadvertently enter into the address decoder mode, it is recommended that the control signal which serves for the activation of the address decoder mode be suitably encrypted. It is possible, after the conclusion of all the test methods of the semiconductor memory device, to bring the address decoder device permanently into the address normal mode by the destruction of selection fuses of the semiconductor memory device that are provided for this purpose, for example.

In accordance with a further aspect of the invention, the semiconductor memory device, which may preferably be embodied as described above, comprises at least one memory cell array, which has a multiplicity of memory cells arranged in a matrix-like manner at least in regions, at least one data input device for data that are to be written to the memory cell to be addressed and have two logic data states, at least one data decoder device which is signal-connected to the data input device, an address input device and the memory cell array, the address input device preferably being connected to the data decoder device via an address decoder device, the data decoder device, in a data decoder mode, being designed, in the event of data inputting of the first logic data state, to output such a decoded data state to the memory cell array that the memory cell to be addressed is brought into a predetermined first physical memory state, and, in the event of data inputting of the second logic data state, to output such a decoded data state to the memory cell array that the memory cell to be addressed is brought into a predetermined second physical memory state.

The data decoder device thus enables, in its data decoder mode, a "data scrambling" of logic data that are to be input into the data input device. Since the data decoder device is integrated into the semiconductor memory device, a complicated "data scrambling" method, prone to errors, need not be programmed in an external test system, for example. Instead, the external test system can, in a simple manner, output a first logic data state to the semiconductor device if the memory cell to be addressed is intended to be brought into a first physical memory state. Accordingly— irrespective of whether the memory cell to be addressed is a "normal" or "inverted" memory cell—a second logic data state can be output to the semiconductor memory device in order to transfer the memory cell to be addressed into the second physical memory state. In order to be able to decide whether the memory cell to be addressed is a "normal" or an "inverted" memory cell, the data decoder device requires the address information of the memory cell to be addressed. The data decoder device obtains this address information preferably from the address decoder device or—if the address scrambling is not integrated in the semiconductor memory device—directly from an address decoder device of the external test system.

In accordance with a further preferred embodiment, the semiconductor memory device comprises at least one data output device for data that are to be read from the memory cell to be addressed and have two logic data states, the data decoder device being signal-connected to the data output device and being designed to output data with the first logic data state to the data output device if the memory cell to be addressed is in the first physical memory state and to output data with the second logic data state to the data output device if the memory cell is in the second physical memory state.

Consequently, in the data decoder mode, data read from the memory cell array are "descrambled" before they are output to the data output device of the semiconductor memory device. Irrespective of whether the memory cell that is to be addressed and is intended to be read is a "normal" or an "inverted" cell, logic data states which correspond directly to the physical memory states of the memory cell to be addressed are thus output to the data output device. If an external test system receives, for example, a first logic data state from the data output device of the semiconductor memory device, then it can directly conclude that the memory cell to be read must have been in the first physical memory state. Consequently, a conventionally required inverted "data scrambling" does not have to be programmed in the external test system.

The data decoder device is preferably signal-connected to an address register of the address decoder device. In order to be able to carry out the "data scrambling", the data decoder device requires—as already explained above—the address information items of the memory cell to be addressed, in order to be able to assess whether a "normal" or an "inverted" memory cell is involved. These address information items are made available to the data decoder device by the address decoder device by means of the address register.

In accordance with a further preferred embodiment, the data decoder device has at least the data decoder mode and a data normal mode, which can preferably be selected externally, decoding of data being effected only in the data decoder mode.

Consequently, the "data scrambling" by the data decoder device is effected only when the data decoder mode of the data decoder device has been selected, for example, by a control signal that is to be input externally. Such activation of the data decoder mode can be effected, for example, in a similar manner to the activation of the address decoder mode of the address decoder device. If the data decoder device is in the data normal mode, it behaves similarly to a conventional semiconductor memory device, i.e. the input and output data are not subjected to an additional "data scrambling" method by the data decoder device.

In accordance with a further preferred embodiment, the data decoder device has a preferably externally selectable topology-generating mode which is designed in such a way that, preferably independently of the data input into the data input device, such data are output to the memory cell array that a predetermined and/or programmable data topology, in particular a chessboard, line, multiple-line and/or a uniform-solid topology of memory cells in the first and the second physical memory state, is generated at least in a part of the memory cell array.

Consequently, in the topology-generating mode, the memory cell array can be brought in a simple manner into a predetermined or predeterminable and/or programmable topology of physical memory states of the memory cells. Preferably, the data which are input into the data input device of the semiconductor memory device by the external test system need not be designed for the generation of the desired data topology. Rather, preferably arbitrary data can be input into the data input device of the semiconductor memory device by the test system, since, in the topology-generating mode, the data decoder device outputs suitable data to the memory cell array in accordance with the desired data topology. In this case, it may be provided that the predetermined or predeterminable and/or programmable topologies are selected by means of control signals to be input, if appropriate in conjunction with a data signal that is likewise to be input. By way of example, the basic topology (e.g. a chessboard topology) can be selected by means of the control signal and a special topology of said basic topology (e.g. a chessboard topology with a logic "1" or "0" in the top left corner) can be selected by means of the data signal to be input, so that a selection between complementary topologies is possible by means of the data to be input. However, the topologies can also be selected completely independently of the data input into the data input device, exclusively using the control signal.

The invention is described below by way of example with reference to accompanying drawings of a synchronous semiconductor memory device. In the figures:

DETAILED DESCRIPTION

Figure 1:
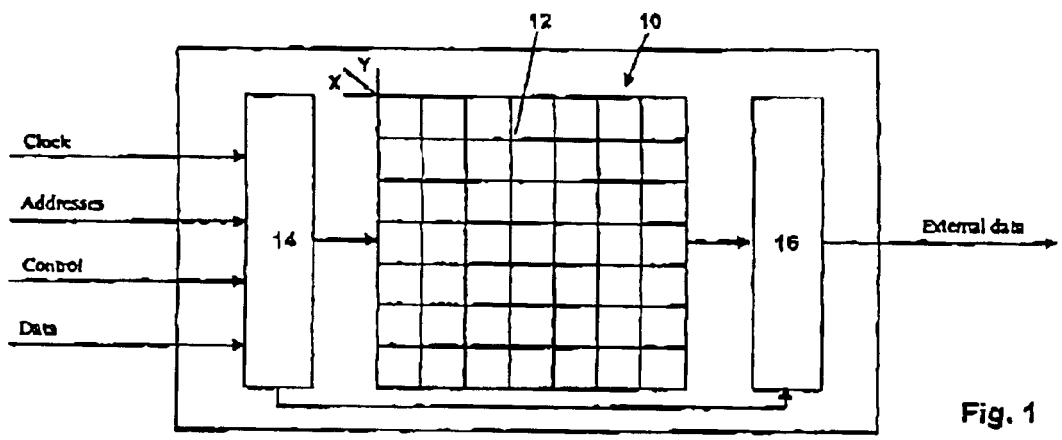
FIG. 1 shows a highly diagrammatic plan view of an embodiment of a semiconductor memory device according to the invention.

FIG. 1 illustrates a highly diagrammatic plan view of an embodiment of a semiconductor memory device according to the invention. The semiconductor memory device comprises a memory cell array 10, which is formed by a multiplicity of individual memory cells 12. The memory cells 12 are arranged in a matrix-like manner, so that the physical position of each memory cell 12 can be uniquely described by specifying a row and a column of the memory cell array 10. Each of the memory cells 12 is thus accorded a unique physical address (X; Y). The memory cell array 10 is a cell array of a DRAM memory, for example.

In order to be able to perform a write or read operation with regard to one of the memory cells 12, this memory cell 12 must be electrically addressed by means of row and column decoders (not illustrated). The electrical address (X'; Y') which is to be communicated to the memory cell array 10 for this purpose does not coincide with the physical address (X; Y), which corresponds to the geometrical position of the memory cell in the matrix-like memory cell array 10, in the case of all the memory cells 12. Physical and electrical address counting accordingly differ in the case of the memory cell array 10.

The semiconductor memory device furthermore comprises a chip input region 14 and a chip output region 16. The chip input region 14, which is shown enlarged in FIG. 2, has, in particular, inputs for a clock, address, control and data signal. In particular, the chip input region 14 comprises an address input device (not illustrated) and also a data input device (not illustrated). The address input device is connected to an address decoder device 18 and the data input device is connected to a data decoder device 20.

In order that an address decoder mode of the address decoder device 18 can be activated externally, the address decoder device furthermore has a control signal input. By inputting control signals into the address decoder device 18 via the control signal input, it is thus possible to change over between the address decoder mode and an address normal mode. If the address decoder device 18 is in the address decoder mode, "address scrambling" of addresses which are input into the address input device is effected.

A memory cell 12 of the memory cell array 10 that is to be addressed can be addressed in the address decoder mode in a simple manner by inputting the physical address of this memory cell 12 into the address decoder device via the address input device. The address decoder device 18 subsequently decodes the physical address of the memory cell 12 and outputs the electrical address assigned to this memory cell 12 for addressing purposes to the memory cell array 10 (i.e. to the row and column decoders). By way of example, if the top left memory cell 12 (physical address (X=0; Y=0)) is intended to be addressed by an external test system, then it suffices to input this physical address into the semiconductor memory device.

If the address decoder mode is deactivated, i.e. the address normal mode is activated, the address decoder device 18 behaves passively. Input addresses are looped through in the address normal mode without additional address scrambling by the address decoder device 18, so that the semiconductor memory device behaves as if there were no address decoder device 18 present. The default state of the semiconductor memory device is the address normal mode, which will always be present when a user accesses the semiconductor memory device. The address decoder mode can only be selected given knowledge of the (preferably) coded activation sequence, which is only necessary during the testing of the semiconductor memory device.

Figure 2:
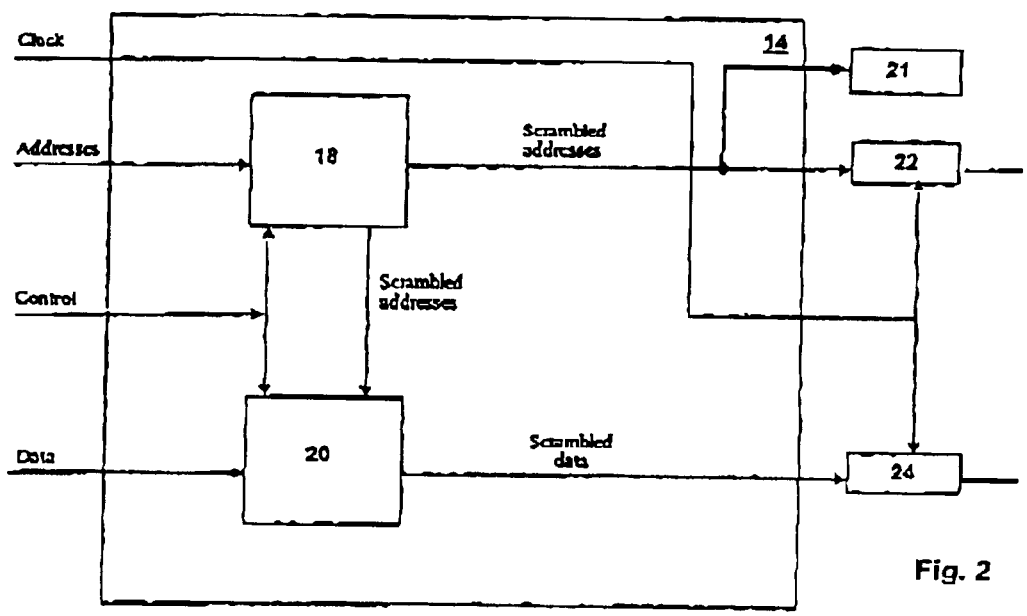
FIG. 2 shows a highly diagrammatic plan view of an input region of the semiconductor memory device of FIG. 1.

The decoded addresses, designated as "scrambled addresses" in FIG. 2, are conducted from the address decoder device 18 in the case of a synchronous semiconductor memory device to a latch 22, from where they are forwarded in the direction of the memory cell array 10. At the same time, these "scrambled addresses" are buffer-stored in a register 21, so that—as will be described in connection with FIG. 3—the address information items are available when "descrambling" the data read.

The chip input region 14 furthermore comprises the data decoder device 20, which—if the data decoder mode is activated—is responsible for the "data scrambling" of input data. Depending on whether the memory cell 14 to be addressed is a "normal" one (for example a memory cell in which a logic "0" is represented as a negatively charged storage capacitor) or an "inverted" one (for example a memory cell in which a logic "0" is represented as a positively charged storage capacitor), the logic data state which is output in the direction of the memory cell array 10 by the data decoder device 20 is inverted or is not inverted.

If the data decoder mode of the data decoder device 20 is not activated by a corresponding activation signal (control), then decoding of input data is not effected. In this data normal mode, the semiconductor memory device behaves as if there were no data decoder device 20 present. The data output by the data decoder device 20, which are designed as "scrambled data" in FIG. 2, are conducted in the case of a synchronous semiconductor memory device to a latch 24, and from there to the memory cell array 10. In the case of asynchronous semiconductor memory devices, it is possible to provide a circuit that deviates from the output-side latches 22 and 24.

It is equally possible to implement only the data decoder device without the address decoder device in the chip input region 14 of the semiconductor memory device. In this case, the address information items required for the data scrambling may be provided for example directly by an external test system which performs the address scrambling.

Figure 3:
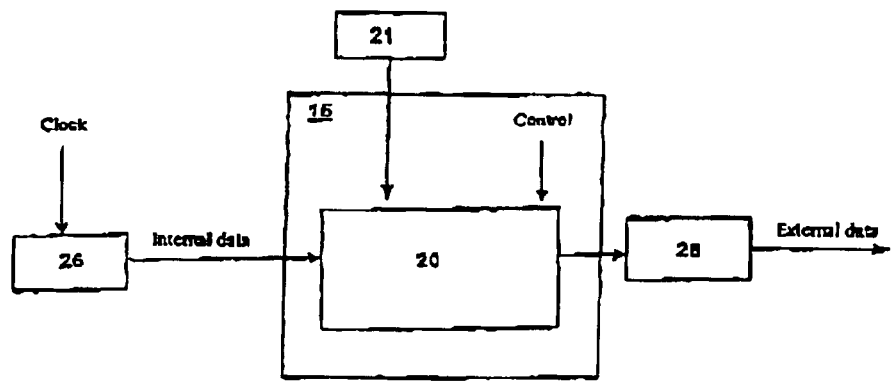
FIG. 3 shows a highly diagrammatic plan view of an output region of the semiconductor memory device of FIG. 1.

The chip output region 16 of the semiconductor memory device is shown enlarged in FIG. 3. In the case of a synchronous semiconductor memory device, data of an addressed memory cell 12 of the memory cell array 10 pass as "internal data" via a latch 26, which is signal-connected to an (internal) clock signal, into a second part of the data decoding device 20. This part of the data decoding device 20 need not be spatially separated from the data decoding device 20 illustrated in FIG. 2, but rather can be arranged as a continuous data decoding device. As further signal inputs, the address information (scrambled addresses) from the register 21, said address information being assigned to the data read out, enter into the data decoding device 20 of FIG. 3, the data decoding device 20 requiring said address information in order to enable the read data to be "descrambled" in a data decoding mode. Depending on whether the addressed memory cell 12 which was read is a "normal" or an "inverted" memory cell, an inversion of the logic data state is effected, if appropriate, in the data decoding device 20 of FIG. 3, so that a direct conclusion as to whether the addressed memory cell 12 is in the first or the second physical memory state can be drawn in a simple manner on the basis of the output data state (external data output by the output driver 28 in FIG. 3).

During operation of the embodiment of the semiconductor memory device according to the invention which is illustrated in FIGS. 1 to 3, it must be taken into account that [lacuna] the complicated logic processes which are required for the "address scrambling" and "data scrambling" in the address decoding device 18 and the data decoding device 20, a time delay Δt will be effected between incoming and outgoing signals. In other words, a specified address or input data are present at the actual input of the memory component only with a typical delay time of Δt.

Consequently, care must be taken to ensure that the delay time Δt caused by the "scrambling" does not lead to the occurrence of a clash with the time tSETUP of the semiconductor memory device. Expressed in simplified fashion, the time tSETUP of a memory component is that time in which the addresses or data to be input must already be present at the corresponding input before the clock signal in order that they can be read properly. A process of reading the states of the input devices of the semiconductor memory device is normally effected in a manner triggered at the rising edge of the clock signal, it being necessary, for proper operation, that data and addresses to be input are already present at the input a period of time tSETUP before this signal edge of the clock signal.

If the time delay Δt of the address decoder device 18 or of the data decoder device 20 is constant, then the time delay Δt brought about by the scrambling only causes a temporal preshifting of the address or data signals to be input. Similarly, the "descrambling" of the data in the output region 16 likewise only causes a constant time shift. In this case, it must be taken into consideration that the address decoder device 18 and also the data decoder device 20 of the input region 14 and the data decoder device 20 of the output region can cause different time delays Δt. The semiconductor memory device can thus be tested at full frequency—despite address and/or data scrambling. Typically, no time-critical interface parameters such as the afore-mentioned input parameters tSETUP, tHOLD or the output parameters such as tAC, tOH, tHZ and tLZ are used in test methods of the memory cell array 10. The delay Δt caused by the on-chip scrambling can advantageously be located in these times.

LIST OF REFERENCE SYMBOLS

10 Memory cell array
12 Memory cell
14 Input region
16 Output region
18 Address decoder device
20 Data decoder device
21 Register
22 Latch
24 Latch
26 Latch
28 Output driver.

What is claimed is:

1. A method comprising:
provisioning a semiconductor memory device having at least one memory cell array, which has a multiplicity of memory cells arranged in a matrix-like manner at least in regions, each of the memory cells being assigned a physical address corresponding to the physical position of the memory cell in the memory cell array and an electrical address corresponding to the electrical addressing of the memory cell in the memory cell array;
inputting of a physical address of a memory cell of the memory cell array that is to be addressed into an address input device of the semiconductor memory device;
decoding of the input physical address into the assigned electrical address of the memory cell to be addressed by an address decoder device of the semiconductor memory device;
outputting of the electrical address to the memory cell array in order to address the memory cell to be addressed;
inputting data that to be written to the memory cell, to be addressed, and have two logic data states into a data input device of the semiconductor memory device;
decoding of the input data by a data decoder device of the semiconductor device in such a way that in the event of data inputting of the first logic data state, such a decoded data state is generated which is assigned to a predetermined first physical memory state of the memory cell to be addressed, and in the event of data inputting of the second logic data state, such a decoded data state is generated which is assigned to a predetermined second physical memory state of the memory cell to be addressed; and
outputting of the decoded data state to the memory cell array in order to bring the memory cell to be addressed into the respective physical memory state.

2. The method of claim 1 further comprising:
inputting of data that are to be written to the memory cell to be addressed and have two logic data states to a data input device of the semiconductor memory device;
outputting of such data to the memory cell array that a predetermined and/or programmable data topology, in particular a chessboard, line, multiple-line and/or a uniform-solid topology of memory cells in a first and a second physical memory state, is generated, preferably independently of the data input into the data input device, at least in a part of the memory cell array.

3. A memory device comprising:
at least one memory cell array, which has a multiplicity of memory cells arranged in a matrix-like manner at least in reasons, each of the memory cells being assigned a physical address corresponding to the physical position of the memory cell in the memory cell array and an electrical address corresponding to the electrical addressing of the memory cell in the memory cell array;
at least one address input device for address inputting of the physical or the electrical address of a memory cell of the memory cell array that is to be addressed; and
at least one address decoder device which is signal-connected to the address input device and the memory cell array, the address decoder device, in an address decoder mode, being designed, in the event of address inputting of the physical address of the memory cell to be addressed, to output the electrical address assigned thereto to the memory cell array in order to address the memory cell to be addressed,
in the address decoder mode, in the event of address inputting of the physical address of the memory cell to be addressed, the assigned electrical address being output to the memory cell array and in the address normal mode, the input address being output to the memory cell array and
in the address normal mode, the input address being output to the memory cell array.

4. The device of claim 3 further comprising:
at least one memory cell array, which has a multiplicity of memory cells arranged in a matrix-like manner at least in regions,
at least one data input device for data that are to be written to the memory cell to be addressed and have two logic data states, at least one data decoder device which is signal-connected to the data input device, an address input device and the memory cell array, the address input device preferably being connected to the data decoder device via an address decoder device, the data decoder device, in a data decoder mode, being designed, in the event of data inputting of the first logic data state, to output such a decoded data state to the memory cell array that the memory cell to be addressed is brought into a predetermined first physical memory.

5. Semiconductor memory device according to claim 4, having at least one data output device for data that are to be read from the memory cell to be addressed and have two logic data states, the data decoder device being signal-connected to the data output device and being designed to output data with the first logic data state to the data output device if the memory cell to be addressed is in the first physical memory state and to output data with the second logic data state to the data output device if the memory cell is in the second physical memory state.

6. Semiconductor memory device according to claim 4, wherein the data decoder device is connected to an address register of the address decoder device.

7. Semiconductor memory device of claim 4 wherein, the data decoder device includes at least the data decoder mode and a data normal mode, which can preferably be selected externally, decoding of data being effected only in the data decoder mode.

8. Semiconductor memory device of claim 4 wherein, the data decoder device includes an externally selectable topology-generating mode which is designed in such a way that, preferably independently of the data input into the data input device, such data are output to the memory cell array that a predetermined and/or programmable data topology, in particular a chessboard, line, multiple line and/or a uniform-solid topology of memory cells in the first and the second physical memory state, is generated at least in a part of the memory cell array.

9. A method comprising:
providing of a semiconductor memory device having at least one memory cell array, the memory cell array having a multiplicity of memory cells arranged in a matrix-like manner at least in regions,
inputting data to be written to the memory cell, to be addressed, and to have two logic data states to a data input device of the semiconductor memory device; and
outputting data from the semiconductor memory device to the memory cell array in response to the input of data to be written to the memory cell array to be addressed such that a predetermined data topology of memory cells in a first and a second physical memory state is generated in at least a part of the memory cell array.

10. The method of claim 9 wherein the predetermined data topology includes a chessboard.

11. The method of claim 9 wherein the predetermined data topology includes linear.

12. The method of claim 9 wherein the predetermined data topology includes multiple lines.

13. The method of claim 9 wherein the predetermined data topology is a uniform solid topology.

14. The method of claim 9 further comprising:
outputting, from the semiconductor memory device, data to the memory cell array independently of the data input into the data input device.

15. The method of claim 9 wherein provisioning of a semiconductor memory device having at least one memory cell array includes programming, into the semiconductor memory device, a data topology to be generated.

16. The method of claim 9 wherein outputting data from the semiconductor memory device includes outputting data generated by the data decoder device.

17. A semiconductor memory device comprising:
at least one memory cell array having a multiplicity of memory cells arranged in a matrix-like manner at least in regions, each of the memory cells being assigned a physical address corresponding to a physical position of the memory cell in the memory cell array and an electrical address corresponding to an electrical addressing of the memory cell in the memory cell array;
at least one address input device for address inputting of the physical or the electrical address of a memory cell of the memory cell array that is to be addressed; and
at least one address decoder device that is signal-connected to the address input device and the memory cell array, the address decoder device, in an address decoder mode, being designed, in the event of address inputting of the physical address of the memory cell to be addressed, to output the electrical address assigned thereto to the memory cell array in order to address the memory cell to be addressed;
at least one data input device for data that is to be written to the memory cell to be addressed and have two logic data states;
at least one data decoder device that is signal connected to the data input device, an address input device and the memory cell array, the address input device being connected to the data decoder device via an address decoder device, the data decoder device, in a data decoder mode, being designed, in the event of data inputting of the first logic data state, to output a decoded data state to the memory cell array such that the memory cell to be addressed is brought into a predetermined first physical memory, in the event of data inputting of the second data state, to output such a decoded data state to the memory cell array so the memory cell to be addressed is brought into a predetermined second physical memory state; and wherein
the data decoder device includes an externally selectable topology-generating mode that is designed in such a way that, preferably independently of the data input into the data input device, such data are output to the memory cell array that a predetermined or programmable data topology, in particular a chessboard, line, multiple line or a uniform-solid topology of memory cells in the first and the second physical memory state, is generated at least in a part of the memory cell array.

18. The semiconductor memory device according to claim 17, further comprising having at least one data output device for data to be read from the memory cell and to be addressed, the data having two logic data states, the data decoder device being signal-connected to the data output device and being designed to output data with the first logic data state to the data output device if the memory cell to be addressed is in the first physical memory state and to output data with the second logic data state to the data output device if the memory cell is in the second physical memory state.

19. The semiconductor memory device according to claim 17, wherein the data decoder device is connected to an address register of the address decoder device.

20. The semiconductor memory device of claim 17 wherein, the data decoder device is configured to provide an externally selected model selected from at least the data decoder mode and a data normal mode.

21. The semiconductor memory device of claim 20 wherein, the data decoder device is configured to decode data only in the data decoder mode.

* * * * *